United States Patent [19]

Tanoue et al.

[11] Patent Number: 5,023,687
[45] Date of Patent: Jun. 11, 1991

[54] SEMICONDUCTOR DEVICE

[75] Inventors: Tomonori Tanoue, Ebina; Chushirou Kusano, Tokorozawa; Susumu Takahashi, Nishitama, all of Japan

[73] Assignee: Hitachi, Ltd., Tokyo, Japan

[21] Appl. No.: 304,210

[22] Filed: Jan. 31, 1989

[30] Foreign Application Priority Data

Feb. 3, 1988 [JP] Japan .................... 63-21955

[51] Int. Cl.⁵ .......................................... H01L 29/72
[52] U.S. Cl. ........................................ 357/34; 357/43; 357/46
[58] Field of Search .................. 357/34, 16, 49, 46

[56] References Cited

U.S. PATENT DOCUMENTS 4,677,455  6/1987  Okajima .............................. 357/46
4,807,008  2/1989  Chang et al. ........................ 357/16
4,821,090  4/1989  Yokoyama .......................... 357/16

Primary Examiner—Jerome Jackson, Jr.
Assistant Examiner—R. Ratliff
Attorney, Agent, or Firm—Antonelli, Terry, Stout & Kraus

[57] ABSTRACT

A complementary semiconductor device is disclosed having a substrate and a four layer structure of pnpn provided on the substrate wherein the first three layers constitute a pnp-type bipolar transistor and the second to the fourth layer constitute an npn-type bipolar transistor. According to the present invention, the pnp- and npn-type transistor which are disposed on different portions of a principal surface of the substrate, respectively, can be produced concurrently by crystal growth and thus production steps are simple and yield is remarkably improved.

21 Claims, 6 Drawing Sheets

SEMICONDUCTOR DEVICE

BACKGROUND OF THE INVENTION

The present invention relates to a method for producing a semiconductor device and, more particularly, it relates to a complementary bipolar integrated semiconductor device which has a high operation speed and has a low power consumption and is easily made in large scale integration and to a method for making it such a complementary bipolar integrated semiconductor device.

Hitherto an Si complementary bipolar integrated circuit has been discussed in the I.E.D.M 84, Technical Digest (1984), pages 753-756.

According to conventional techniques, pnp and npn type transistors have been produced through separate processing steps, and the steps have been complicated and yield has been low. Furthermore, such conventional techniques have had problems that since more high-temperature processing steps are required in the manufacture thereof than for production of either one of pnp or npn type transistors, it has become difficult to implement elements exactly as designed owing to the effect of diffusion of impurities. Moreover, with reference to compound semiconductors, although the "Applied Physics Letter" vol. 46 (3), (1985) pages 302-304 makes mention of npn type transistors, there have been severe restrictions associated therewith and complementary circuits have not yet been realized. Besides, as in the case of Si, when pnp and npn are produced through separate processing steps, the same problems as above occur.

SUMMARY OF THE INVENTION

The object of the present invention is to provide a structure for a transistor from which a large scale integrated circuit of high speed and low power consumption can be produced without the above-mentioned defects, and a method for producing it.

The above object can be attained by using a semiconductor crystal composed of four layers of pnpn and operating the pnp and npn portions thereof as ordinary pnp and npn type transistors, respectively.

The above object can further be attained by using a semiconductor crystal composed of five layers of pnipn and operating the pnip and nipn portions thereof as ordinary pnp and npn type transistors, respectively.

Furthermore, when a compound semiconductor is used as a constituting material, the above object can be attained by allowing at least a part of a p layer or an n layer which is the outermost layer of the laminate structure to have a wider forbidden bandwidth than in other layers.

BRIEF DESCRIPTION OF THE DRAWINGS

FIG. 1 (b) is a schematic view of a modified sectional structure of the semiconductor of FIG. 1.

DETAILED DESCRIPTION OF THE PREFERRED EMBODIMENTS

In the present invention, the first three layers (pnp) of the pnpn four layer structure are used in implementing a pnp type transistor and the layers of from the second layer to the fourth layer (npn) are used in implementing a npn type transistor. Therefore, the present transistor structure can be produced by employing one crystal growth for implementing both the pnp and npn transistors. Thus, a complementary integrated circuit can be produced through a simple step and yield can be remarkably improved. Especially for compound semiconductors, it has become possible for the first time to produce a complementary integrated circuit on the same substrate.

The following examples explain the present invention.

EXAMPLE 1

Figure 1A:
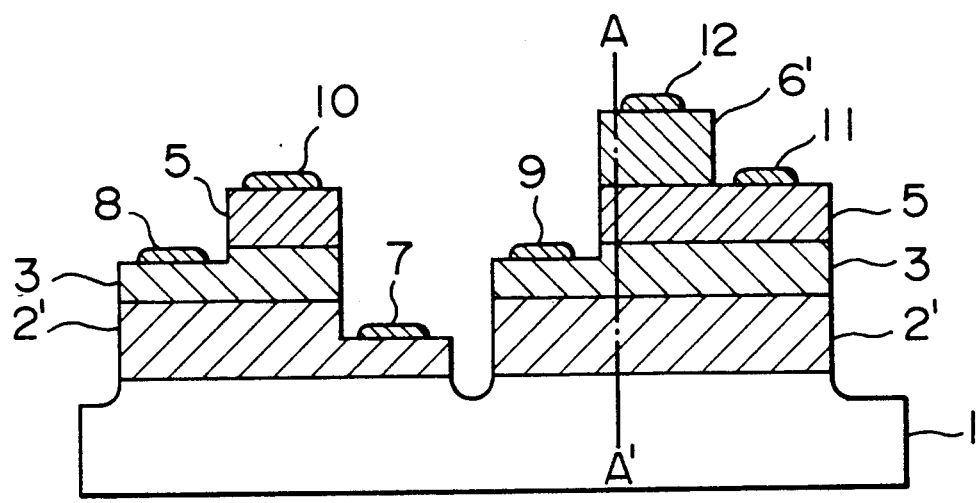
FIG. 1 (a) is a schematic view of a sectional structure of the semiconductor device of Example 1 given hereinafter.
Figure 1B:
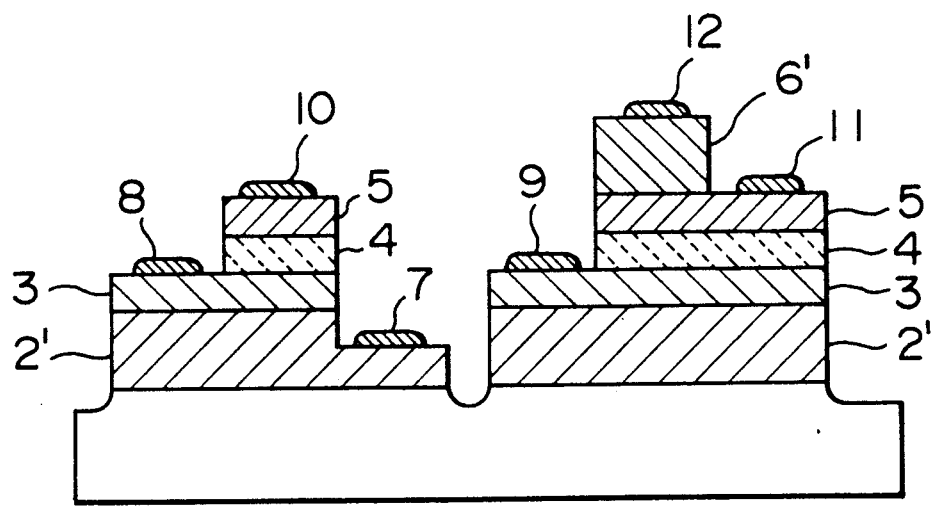

FIG. 1 (a) is a cross-sectional view of structure of the transistor produced in this example. In FIG. 1 (a), 2' indicates p type GaAs layer (impurity density $p = 1 \times 10^{19}/cm^3$, film thickness $d = 0.5$ μm), 3 indicates n type GaAs layer ($n = 5 \times 10^{17}/cm^3$, $d = 2000$ Å), 5 indicates p type GaAs layer ($p = 5 \times 10^{17}/cm^3$, $d = 2000$ Å) and 6' indicates n type GaAs layer ($n = 5 \times 10^{18}/cm^3$, $d = 1000$ Å) and the low impurity density layer indicated by 4 in FIG. 1 (b) was not formed in this example.

The present method of production was as follows. First, layers 2', 3, 5 and 6' were sequentially stacked on a GaAs substrate by molecular beam epitaxy method. In this case, Si was used as the n-type impurity and Be was used as the p-type impurity. The crystal growth can be made by other methods, for example, an organo-metallic CVD method. Further, other impurities such as Sn as n-type and C as p-type may be used if doping thereof can be made to the above mentioned extent without considerable diffusion during the crystal growth.

Figure 2A:
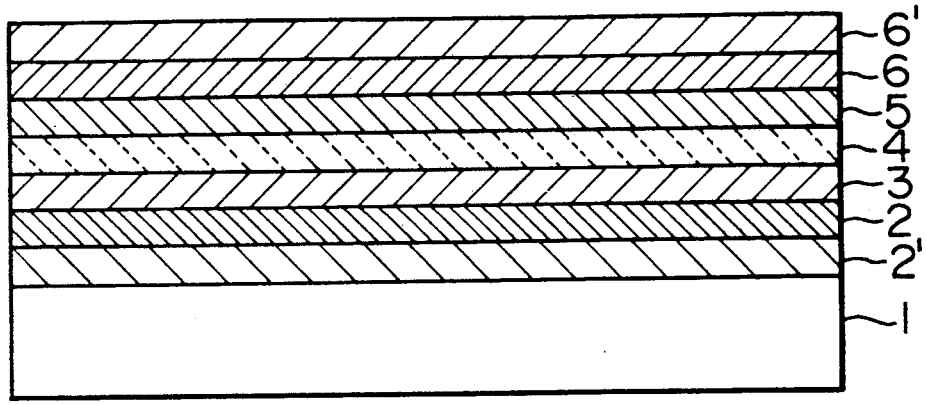
FIGS. 2(a)-2(c) show schematically the steps of production according to Example 2.
Figure 2B:
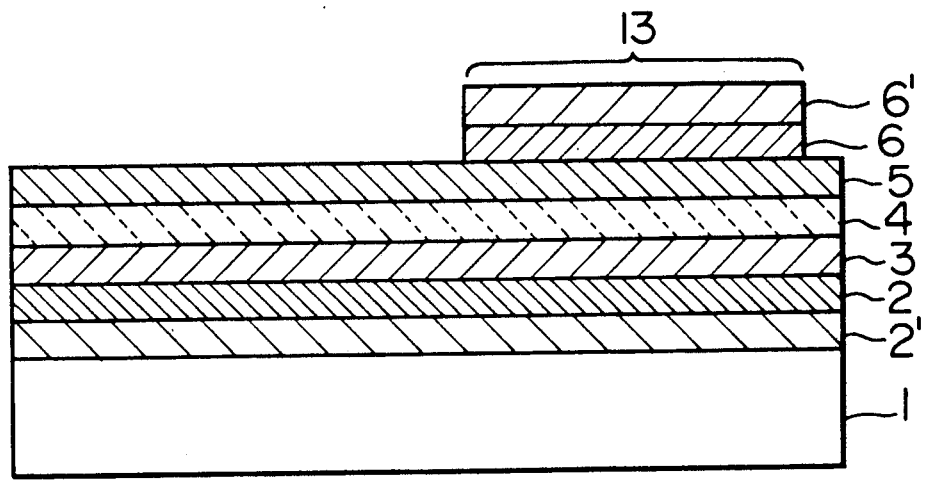
Figure 2C:
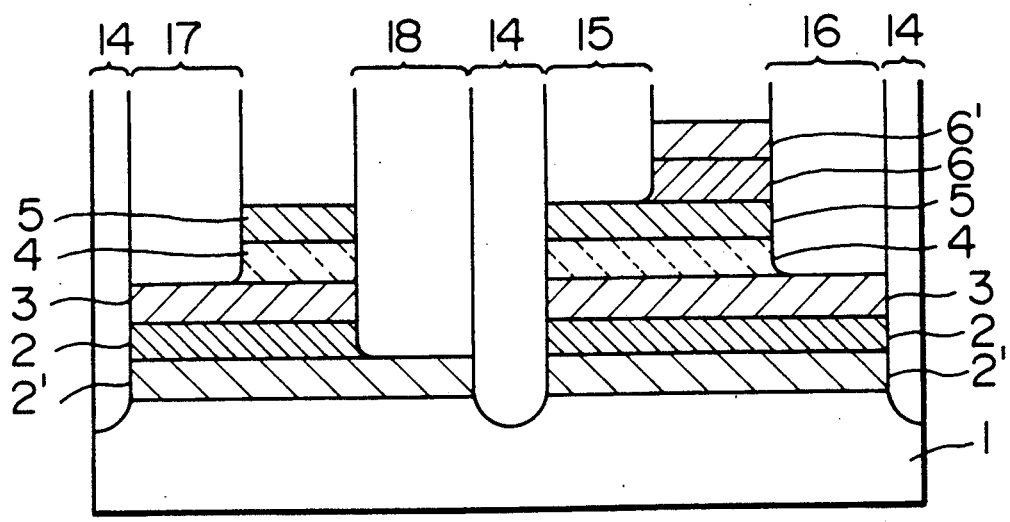
Figure 3:
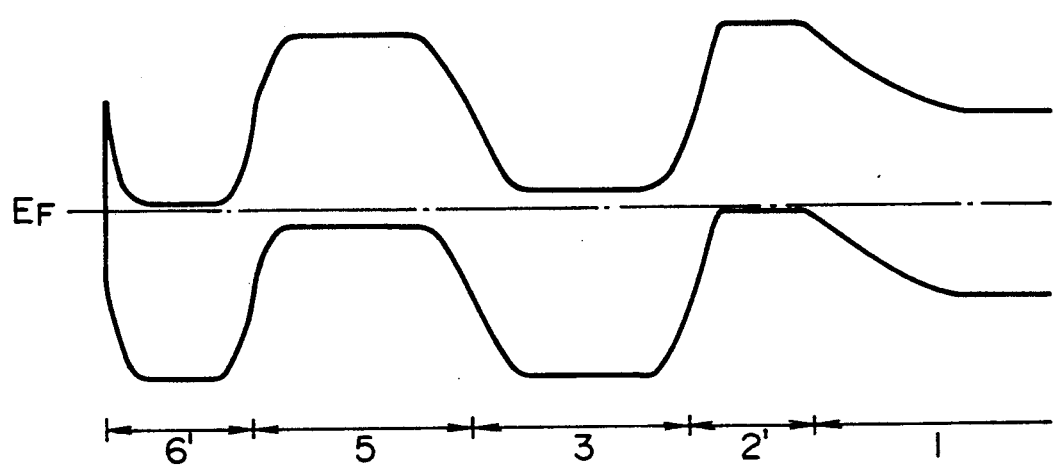
FIG. 3 is a diagram of the band structure along A-A' in FIG. 1.
Figure 4:
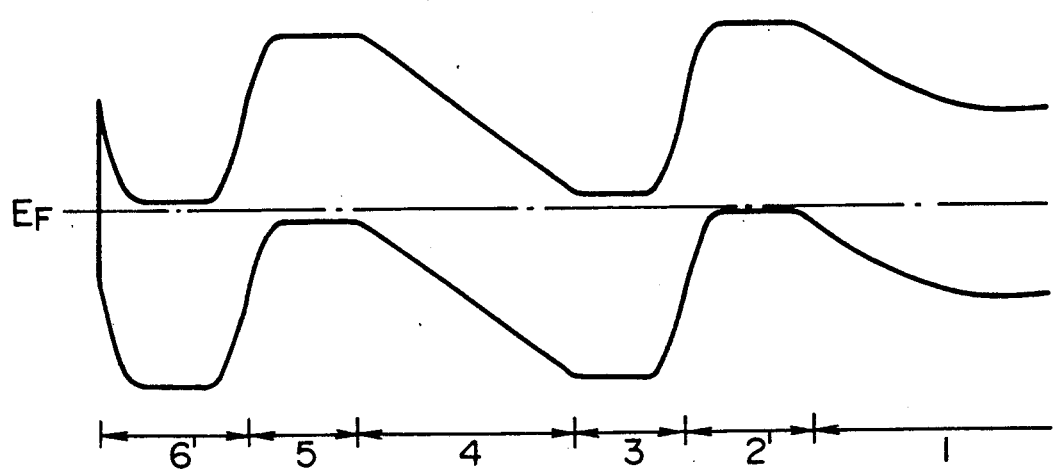
FIG. 4 is a diagram of the band structure of a modification of Example 1.

Next, the crystal was processed to the shape as shown in FIG. 2 by repeatedly carrying out ordinary photolithography and etching. On the right side of FIG. 2(c) between 15 and 16 is a first region where npnp layers remain and an npn transistor is formed using the top three layers thereof, whereas between 17 and 18 in FIG. 2(c) is a second region where pnp layers remain and a pnp transistor is formed. Furthermore, electrodes indicated by 7-12 in FIG. 1 were deposited by repeatedly carrying out photolithography, vacuum evaporation and lifting-off. This was further subjected to a heat treatment (for 2 minutes at 400° C. in $N_2$) to afford ohmic contact between electrode and semiconductor. As electrode materials which can provide good ohmic contact by such heat treatment, AuGe alloy and AuZn alloy were used for n-type GaAs and p-type GaAs, respectively. However, the similar results can also be obtained by using other materials such as AuSn alloy for n-type and AuBe alloy for the p-type. Furthermore, although not shown, a smooth surface converted with $SiO_2$ can be obtained by coating SOG at 5000 Å on the transistor and heat treating it at 300° C. for 10 minutes under ordinary atmospheric conditions. Holes were made through $SiO_2$ by ordinary photolithography and etching with aqueous HF solution to expose an electrode portion. Therein was deposited a wiring metal such as Ti/Al two-layer film and wiring was formed by carrying out further lithography and etching. According to this procedure, it becomes possible to prevent disconnection of wiring disspored at electrode portions of different layer levels, and further, since $SiO_2$ acts as a protective film, it is possible to prevent a change with time of transistor characteristics caused by a deterioration of the semiconductor surface due to water or the like. In order to further improve moisture resistance, a film of phospho-silicate glass (PSG) by hot CVD method or a film of silicon nitride by plasma CVD method can be deposited on the $SiO_2$ film. By wiring on this smoothened film, sufficient reliability can be realized when a large scale integration is effected.

Characteristics of the resulting transistor are as follows. Cut-off frequency $f_T$ of the npn transistor where the upper n-layer is an emitter was 25 GHz and that of the pnp transistor where the lower p-layer is an emitter was 18 GHz. Power consumption per one gate as measured by a ring oscillator using complementary circuit was 0.5 mW and delay time was 53 picoseconds.

In the above example, the upper n-layer of the npn type bipolar transistor function as the emitter whereas the lower p-layer of the pnp type bipolar transistor functions as the emitter thereof however, such layers can also be operated as of bipolar transistors.

EXAMPLE 2

Figure 6:
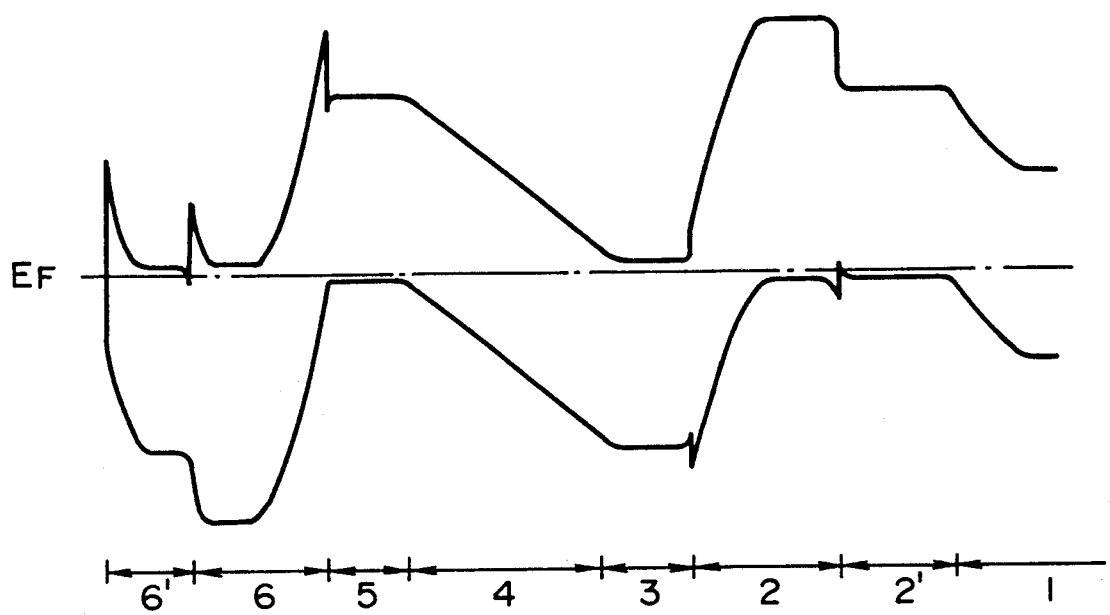
FIG. 6 is a diagram of the band structure of Example 2.

As shown in FIG. 2, on a semi-insulating GaAs substrate were sequentially grown a p-type GaAs layer 2' (impurity density $p=1\times10^{19}/cm^3$, film thickness 0.5 μm), a p-type $Al_xGa_{1-x}As$ layer 2 (x=0.3, impurity density $p=5\times10^{17}/cm^3$, film thickness 0.1 μm), an n-type GaAs layer 3 (impurity density $n=5\times10^{18}/cm^3$, film thickness 0.05 μm), a low impurity density GaAs layer 4 (impurity density: $1\times10^{16}/cm^3$ or less, film thickness 0.3 μm), a p-type GaAs layer 5 (impurity density $p=2\times10^{19}/cm^3$, film thickness 0.08 μm), an n-type $Al_xGa_{1-x}As$ layer 6 (x=0.3, impurity density $n=5\times10^{17}/cm^3$, film thickness 0.1 μm), and an n-type GaAs layer 6' (impurity density $n=5\times10^{18}/cm^3$, film thickness 0.1 μm). Be was used as p-type impurity here, but a similar effect can be obtained with Mg, Mn, C and the like. Si was used as n-type impurity here, but a similar effect can be obtained with Sn, S, Se, Te and the like. The band structure of this crystal in depth direction is as shown in FIG. 6. This crystal was subjected to the same processing as in Example 1 to obtain a transistor of the shape as shown in FIG. 1 (b). Furthermore, the surface of this transistor was smoothened with $SiO_2$ in the same manner as in Example 1 and wiring was made. With reference to electrode material, AuGe alloy was used for n-type GaAs layers 6' and 3 and AuZn alloy was used for p-type GaAs layers 5 and 2'. However, similar results can be obtained by using other materials such as AuSn alloy for the n-type and AuBe ally for the p-type. High frequency characteristics of the resulting transistor were as follows. The npn type transistor: $f_T=35$ GHz, $f_{max}=32$ GHz and the pnp type transistor: $f_T=24$ GHz, $f_{max}=41$ GHz. Power consumption per 1 gate and delay time examined by forming a ring oscillator were 0.3 mW and 41 picoseconds.

Figure 5:
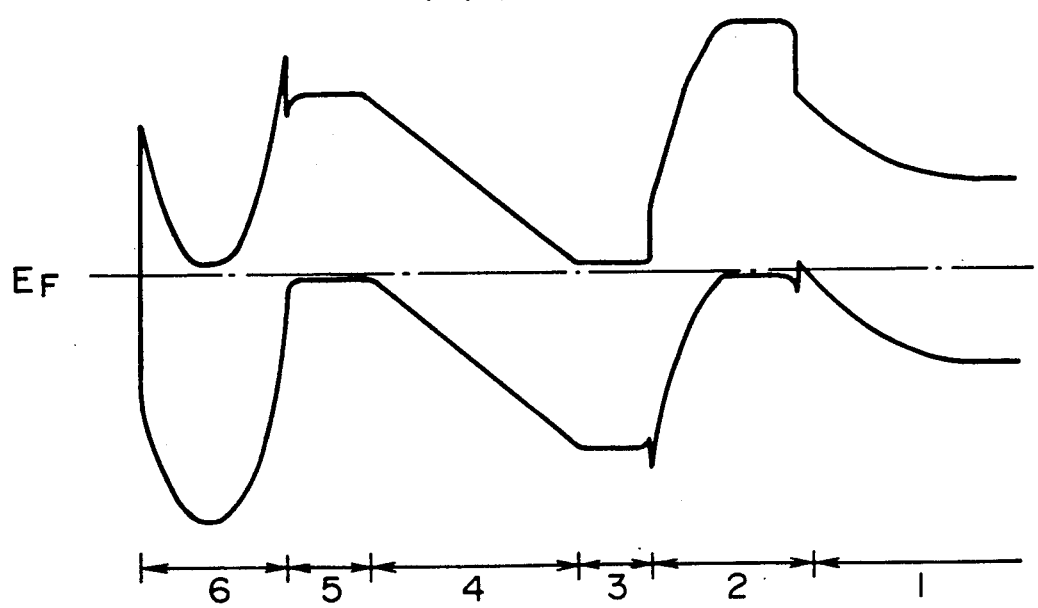
FIG. 5 is a diagram of the modified band structure of a modification of Example 2.

Moreover, in this example, the breakdown voltage was improved considerably by introducing a low impurity density layer 4 into the structure and at least 15 V was obtained as collector to emitter voltage. Also, when the impurity contained in the low impurity density layer 4 is a p-type impurity, the cut-off frequency $f_T$ can be made larger as compared with the case in which an n-type impurity is contained therein. Moreover, there is obtained the effect to improve doping rate by using AlGaAs as layers 2 and 6 which function as emitter layers and a current gain of at least 200 for a transistor was obtained. Layers 2' and 6' were provided for easily attaining ohmic contact and operation per se is not damaged even if these are removed. FIG. 5 is a diagram of a band structure of crystal when layers 2' and 6' were not provided. The value of $f_T$ of a transistor using this crystal was reduced to about 80% of that of the transistor including layers 2' and 6' of this example because of an increase of resistance. However, the complementary circuit operated without hindrance. Power consumption was increased by 10% and gate delay also increased by 20%.

EXAMPLE 3

Before deposition of electrodes in Example 2, H+ ion was implanted into area 15 of FIG. 2 (c) and O+ ion into area 17 at an accelerating voltage of 180 kV and at a dose of $5\times10^{12}/cm^2$. Thereafter, a transistor was produced by the same steps as in Example 2. Since the portions into which ions were implanted became high-resistive resulting in a decrease of junction capacitance, $f_T$ and $f_{max}$ increased, namely, $f_T=35$ GHz and $f_{max}=51$ GHz with respect to the npn type transistor and $f_T=35$ GHz and $f_{max}=47$ GHz with respect to the pnp-type transistor. H+ and O+ were used as ions to be implanted above, but the similar effect can be obtained using other ions such as B+ and F+ if collector base-emitter base junction capacitance is decreased by selecting appropriate acceleration voltage.

EXAMPLE 4

Figure 7:
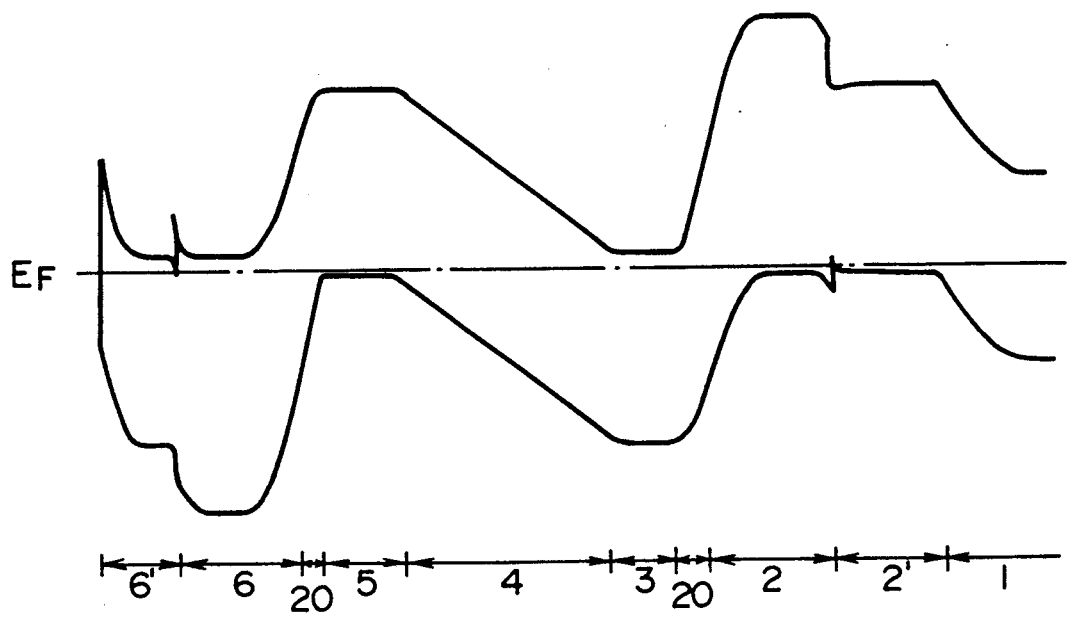
FIG. 7 is a diagram of the band structure of Example 4.

A composition graded layer 20 (film thickness 300 Å) gradually changing in Al compositional ratio from 0.3 to 0 was introduced at $Al_{0.3}Ga_{0.7}As$—GaAs interface, namely, at the interface of layers 2-3 and 5-6 present in the growing crystal in Examples 2 and 3. A diagram of the band structure in depth direction of the crystal in this case is shown in FIG. 7. As a result, there were obtained effects of reduction in series resistance (40%) and reduction in threshold voltage (1.3 V→1.0 V). With the reduction, $f_T$ value increased by 20% and power consumption decreased by 20%.

EXAMPLE 5

The thickness of low impurity density GaAs layer 4 in Examples 2-4 was decreased from 0.3 μm to 0.15 μm. As a result, $f_T$ was improved by about 15% for npn-type transistor and about 10% for pnp-type transistor.

EXAMPLE 6

Figure 8:
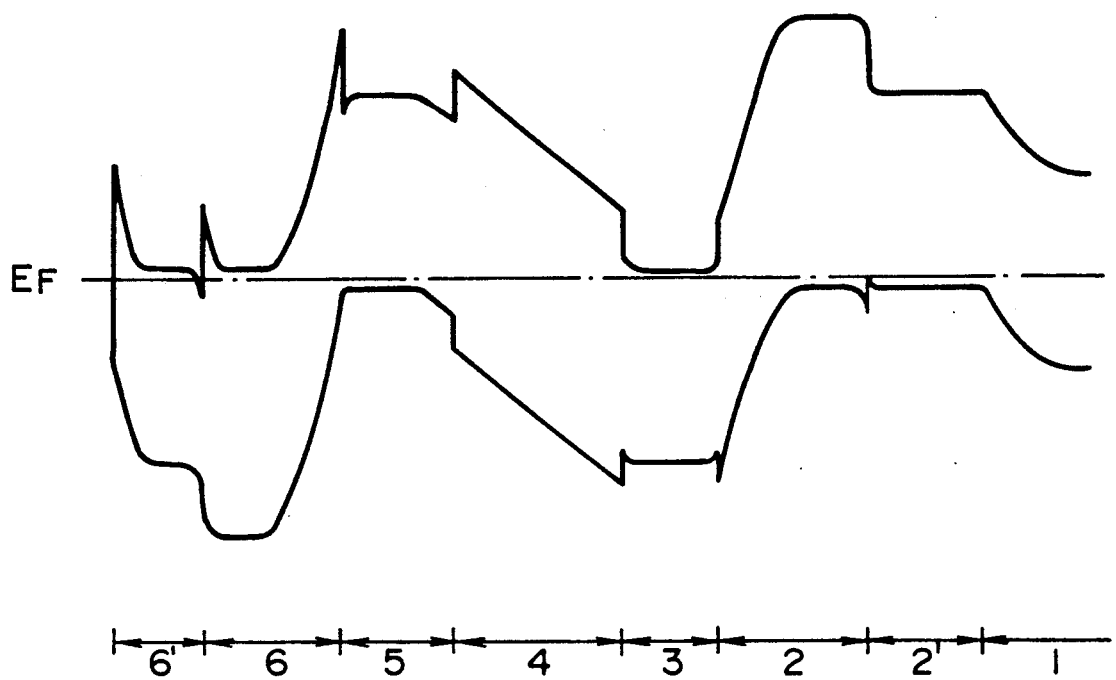
FIG. 8 is a diagram of the band structure of the first case in Example 6.
Figure 9:
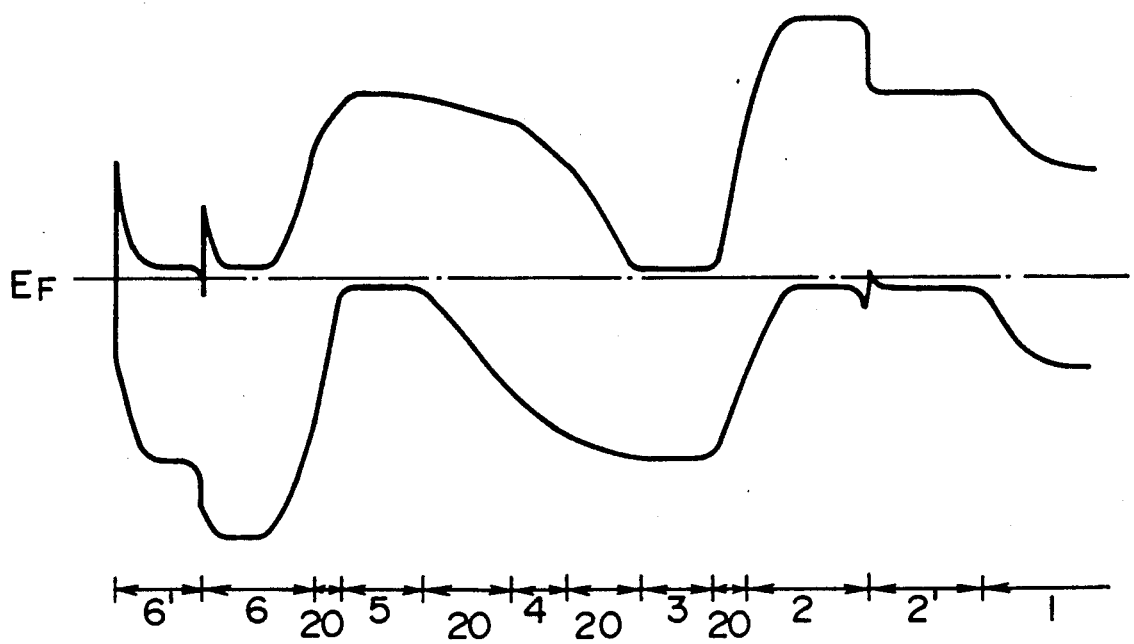
FIG. 9 is a diagram of the band structure of the second case in Example 6.

The low impurity density GaAs layer 4 in Examples 2-5 was substituted by a low impurity density $Al_{0.3}Ga_{0.7}As$ layer. Diagram of band structure in depth direction of crystal in this case is shown in FIG. 8. In this case, accumulation of carrier occurred at interface of layers 3-4 and 4-5 and current gain decreased. Therefore, the same Al composition graded layer of 300 Å as in Example 4 was provided at the interfaces of layers 3-4, 4-5. The diagram of band structure when the Al composition graded layer was provided is shown in FIG. 9. Breakdown voltage of a transistor doubled and the current required to afford maximum $f_T$ also increases by a factor of two. Thus, $f_T$ was improved by about 25%.

EXAMPLE 7

Transistors were produced by exchanging layers 2' and 6', 2 and 6 and 3 and 5, respectively, in Examples 2-6. In this case, n and p type layers were exchanged with each other and hence the npn type transistor and pnp type transistor were exchanged with each other. As a result, $f_T$ and $f_{max}$ changed, namely, $f_T$ decreased by 30% and $f_{max}$ decreased by 50% for the npn type transistor and $f_T$ increased by 25% and $f_{max}$ increased by 5% for the pnp type transistor.

Explanation has been made on specific materials in the above Examples. Other applicable materials will be explained below.

Figure 10:
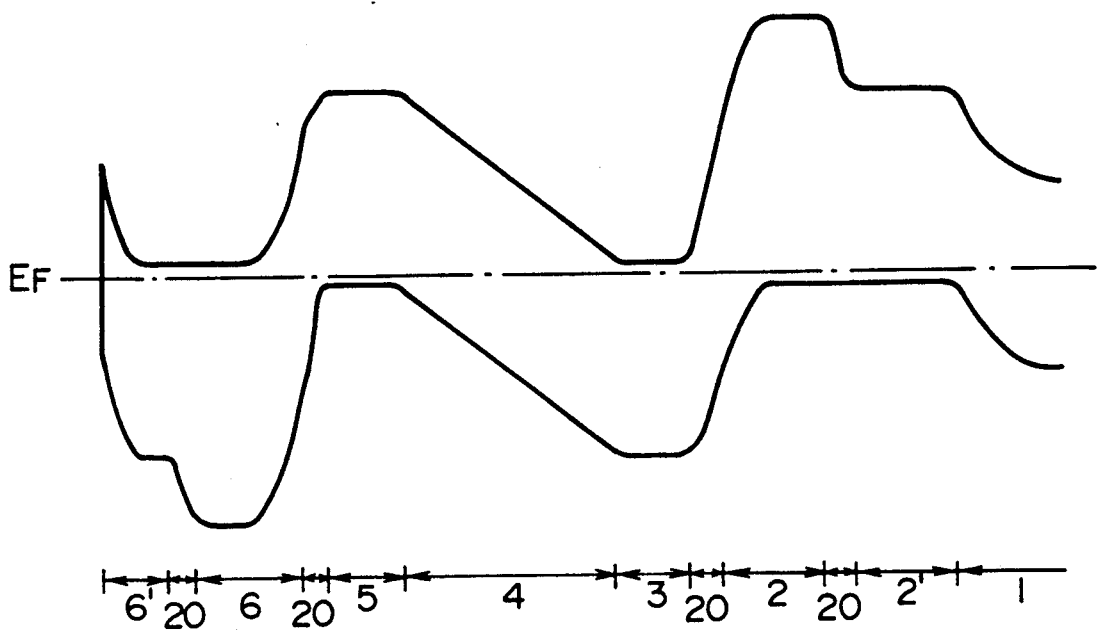
FIG. 10 is a diagram of the modified band structure of a modification of Example 4.
Figure 11:
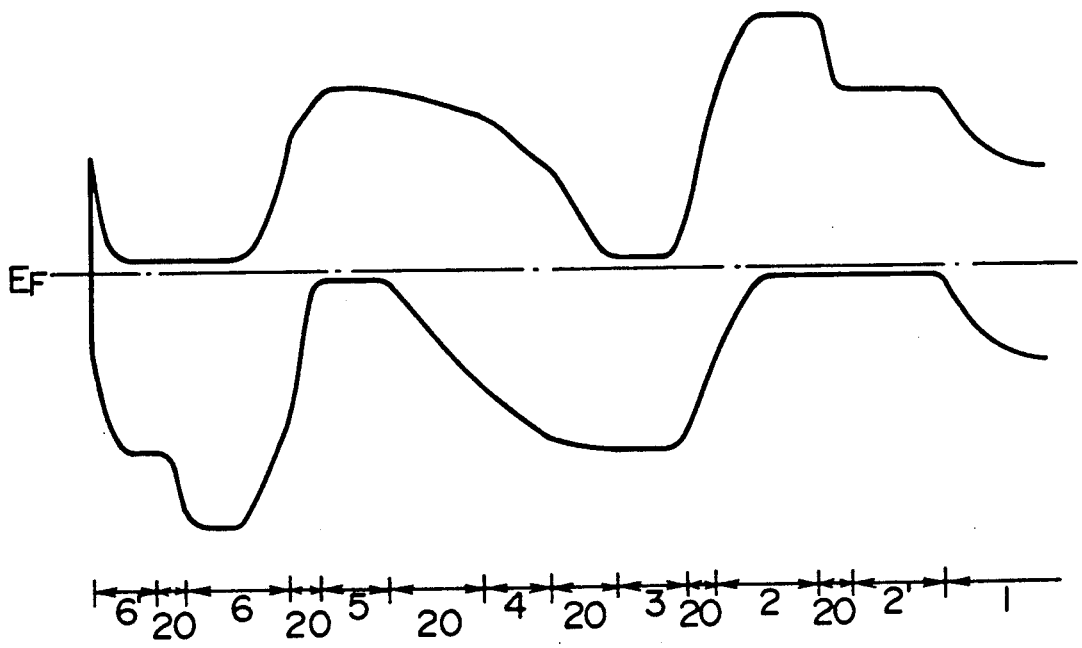
FIG. 11 is a diagram of the modified band structure of a modification of Example 7.

First, with reference to the forbidden bandwidth of a semiconductor, all of layers 2'-6' may have the same forbidden band-width. In this case, the materials may be element or compound semiconductors such as Si, Ge, GaAs, InP, InAs, GaSb and Gap and their alloys such as $Si_xGe_{1-x}$ (x:0-1) alloy, $Al_xGa_{1-x}As$, $In_xGa_{1-x}As$, $GaAs_xP_{1-x}$, $Al_xGa_{1-x}Sb$ and $GaAs_xSb_{1-x}$. It is also possible to increase current gain by changing the forbidden band-width in the multi-layer structure. In this case, it is necessary to form a hetero junction by increasing the forbidden band-width of layers 2 and 6 to be more than about 0.1 eV than those of layers 2', 3, 4, 5 and 6'. In this case, further direct current and high frequency characteristics are improved if a series resistance is decreased by providing a composition graded layer of 300 Å–1000 Å in thickness so that conduction band edge and valence band edge are smoothly connected at interfaces of layers 2'-2 and 6'-6. When such composition graded layer was provided in Examples 4 and 7, the band structure diagrams are as shown in FIG. 10 and FIG. 11, respectively. Examples of combinations of material having a large forbidden band-width and material having a narrow forbidden band-width which are usable in such a structure, are: $Al_xGa_{1-x}As$ ($x \geq 0.1$)—GaAs, Si—$Ge_xSi_{1-x}$ ($x \geq 0.1$), InP—$In_x$-$Ga_{1-x}As$ ($x \geq 0.1$), GaP—Si, GaAs—Ge, InAlAs—InGaAs, InP—InGaAs, GaP—GaAsP, GaAsP—GaAs, and $Al_xGa_{1-x}Sb$—GaSb ($x \geq 0.1$).

Further, when the transistor is operated at a high current density of more than $10^4$ A/cm² or when the breakdown voltage of the collector thereof must be especially high ($\geq 20$ V), deterioration of transistor characteristics under high current density and high voltage can be prevented by increasing the forbidden band-width of the intrinsic collector layer 4 to the extent similar to that of layers 2 and 6 in the above case. Combinations of materials usable in this case are the same as mentioned above. Similar improvements to those mentioned above can be attained by providing a forbidden band-width graded layer at the interface between layers 4 and 3 and layers 5 and 4 in the same manner as mentioned above.

Film thickness and impurity density:

Ranges of thickness and impurity density of respective layers which may be selected are shown below in the sequence of (1) layer No., (2) impurity density n or p and (3) thickness d.

Layer 2': $n \geq 1 \times 10^{18}/cm^3$, $d \geq 2000$ Å
Layer 2': $n \geq 1 \times 10^{17}/cm^3$, $d \geq 500$ Å
Layer 3: $n \geq 1 \times 10^{17}/cm^3$, 2000 Å $\geq d \geq 300$ Å
Layer 4: P, $n \leq 1 \times 10^{16}/cm^3$, 1 μm $\geq d \geq 1000$ Å
Layer 5: $n \geq 1 \times 10^{17}/cm^3$, 2000 Å $\geq d \geq 300$ Å
Layer 6: $p \geq 1 \times 10^{17}/cm^3$, $d \geq 500$ Å
Layer 6': $p \geq 1 \times 10^{18}/cm^3$, $d \geq 1000$ Å

The impurity density is subjected to further limitation by the forbidden band-width of the respective layers. If the forbidden band-width of all layers are identical, the impurity density of layer 2 and that of layer 3 (referred to as $n_2$ and $p_3$, respectively) must have the relation of $n_2 \geq 10\, p_3$. Furthermore, impurity density of layer 5 and that of layer 6' must also have the relation of $p_6 \geq 10 \times n_5$ (the symbols have the similar meanings to those in the above formula). When the forbidden band-width of layer 2 and that of layer 6 are wider than those of other layers by 0.1 eV or more, the operation of the transistor is satisfactory with respect to all of the above-mentioned regions.

EXAMPLE 8

In FIG. 2 (a), 1 indicates an Si substrate (n-type impurity density $1 \times 10^{16}/cm^3$). On this substrate were sequentially grown B doped p-type Si layers 2' and 2 (impurity density $p = 1 \times 10^{20}/cm^3$, thickness 0.5 μm), As doped n-type Si layer 3 (impurity density $n = 1 \times 10^{18}/cm^3$, thickness 0.2 μm), low impurity density layer 4 (impurity density $5 \times 10^{15}/cm^3$, thickness 0.4 μm), B doped p-type Si layer 5 (impurity density $p = 2 \times 10^{18}/cm^3$, thickness 0.1 μm), and As doped n-type Si layers 6 and 6' ($n = 1 \times 10^{20}/cm^3$, thickness 0.5 μm). Then, as shown in FIG. 2 (b), the portion other than region 13 which is to be npn-type transistor was subjected to etching by ordinary photolithography and ordinary etching until layer 5 was exposed. Further, as shown in FIG. 2 (c), isolation region 14, pnp-type transistor emitter region 18, pnp-type transistor base region 17, npn-type transistor collector region 16, and npn-type transistor base region 15 were formed by processing according to ordinary photolithography and etching. To the thus processed crystal were applied electrodes using a metal such as Al and polycrystal silicon doped with impurity which can afford ohmic contact to obtain a transistor as shown in FIG. 1 (b). Then, smoothening and wiring were effected in the same manner as in Example 2, although these procedures are not shown in the drawings. High frequency characteristics of this transistor were measured to obtain a maximum cut-off frequency $f_T$ of 20 GHz and maximum oscillatable frequency $f_{max}$ of 22 GHz for npn-type transistor and $f_T$ of 15 GHz and $f_{max}$ of 20 GHz for pnp-type transistor. A ring oscillator was prepared by complementary circuit using these npn and pnp transistors and a delay per 1 gate was measured to obtain a power consumption of 0.1 mW and a delay time of 61 picoseconds per 1 gate. Yield of integrated circuit was 60% of complete operation for circuit of 200 in element number.

EXAMPLE 9

When thickness of layer 4 in Example 8 was changed to 0.2 μm, $f_T$ of npn and pnp transistors were 30 GHz and 20 GHz, respectively. Yield increased to 70% under the above-mentioned conditions.

EXAMPLE 10

In Example 8, layers of up to layer 4 were prepared by crystal growth and layers 5, 6 and 6' were formed by introduction of impurity from the surface by diffusion. In this case, thickness of layer 4 upon crystal growth was 0.6 $\mu$m and thickness after diffusion was 0.35 $\mu$m by deduction of thicknesses of layers 5 and 6 which were 0.1 $\mu$m and 0.5 $\mu$m, respectively. Performance of the elements was the same as in Example 8.

EXAMPLE 11

A transistor was prepared in the same manner as in Example 8 except that layer 2 and layers 6 and 6' were exchanged and layer 3 and layer 5 were exchanged. In this case, however, since pnp-type transistor and npn-type transistor were replaced with each other, it is necessary to use electrode materials which can afford ohmic contacts, respectively. Characteristics of respective elements were as follows: $f_T$ and $f_{max}$ of npn-type transistor were 16 GHz and 26 GHz, respectively, and $f_T$ and $f_{max}$ of pnp-type transistor were 18 GHz and 20 GHz, respectively.

In Examples 8-11, n-type Si substrate (impurity density $n=1\times10^{16}/cm^3$) was used, but nearly the same values of characteristics for both the n-type and p-type transistors are obtained by using other substrates as long as impurity density thereof is $5\times10^{18}/cm^3$ or less. Furthermore, similar characteristics can be obtained by using an insulator substrate such as sapphire and this is advantageous in preparation of circuits of high integration because parasitic capacitance such as wiring capacitance is reduced.

According to the present invention, transistors of both the pnp-type and npn-type can be produced by one crystal growth. Therefore, a complementary integrated circuit can be produced by a simple step and yield can be markedly improved. Especially, complementary integrated circuits can be produced with compound semiconductors.

What is claimed is:

1. A semiconductor device comprising:
a first region on a substrate having a first bipolar transistor formed thereon, the first bipolar transistor including a stacked arrangement of:
a first semiconductor layer, for providing one of collector and emitter regions, having a first conductivity type,
a second semiconductor layer, for providing a base region, being formed on the first semiconductor layer and having a second conductivity type, opposite to the first conductivity type,
a third semiconductor layer formed on the second semiconductor layer and having an impurity density equal to or smaller than $1\times10^{16}/cm^3$, the third semiconductor layer being substantially intrinsic,
a fourth semiconductor layer, for providing the other one of the collector and emitter regions, being formed on the third semiconductor layer and having the first conductivity type,
a first electrode electrically connected to the first semiconductor layer,
a second electrode electrically connected to the second semiconductor layer, and
a third electrode electrically connected to the fourth semiconductor layer; and
a second region on the substrate, at a different portion thereof, having a second bipolar transistor formed thereon, the second bipolar transistor including a second stacked arrangement of:
a first semiconductor layer having the first conductivity type,
a second semiconductor layer, for providing one of collector and emitter regions, being formed on the first semiconductor layer and having the second conductivity type,
a third semiconductor layer formed on the second semiconductor layer and having an impurity density equal to or smaller than $1\times10^{16}/cm^3$, the third semiconductor layer being substantially intrinsic,
a fourth semiconductor layer, for providing the base region, being formed on the third semiconductor layer and having the first conductivity type,
a fifth semiconductor layer, for providing the other one of the collector and emitter regions, being formed on the fourth semiconductor layer and having the second conductivity type, the fifth semiconductor layer functioning similarly as is the first semiconductor layer of the first bipolar transistor,
a first electrode thereof being electrically connected to the second semiconductor layer,
a second electrode thereof being electrically connected to the fourth semiconductor layer, and
a third electrode thereof being electrically connected to the fifth electrode,
wherein the stacked first, second, third and fourth semiconductor layers of the first region are disposed along planes which are in common and which would intersect, if extended, with planes corresponding to the first, second, third and fourth semiconductor layers of said second region, respectively.

2. A semiconductor device according to claim 1, wherein said third semiconductor layer of both said first and second bipolar transistors has a forbidden band-width wider than that of the second and the fourth semiconductor layers.

3. A semiconductor device according to claim 2 or 1 wherein the semiconductor layers corresponding to the first and second bipolar transistors are comprised of compound semiconductors.

4. A semiconductor device according to claim 3, wherein at least a part of the first semiconductor layer corresponding to the first and second bipolar transistors has a forbidden band-width wider than that of the second, third and fourth semiconductor layers thereof.

5. A semiconductor device according to claim 3, wherein a part of the fifth semiconductor layer has a forbidden band-width wider than that of the first, second and fourth semiconductor layers.

6. A semiconductor device according to claim 2, wherein in the first bipolar transistor the first semiconductor layer provides the emitter region, the fourth semiconductor layer provides the collector region thereof and the first, second and third electrodes thereof correspond to emitter, base and collector electrodes, respectively, and wherein in the second bipolar transistor the second semiconductor layer provides the collector region, the fifth semiconductor layer provides the emitter region thereof and the first, second and third electrodes thereof correspond to collector, base and emitter electrodes, respectively.

7. A semiconductor device according to claim 1, wherein the first and the second conductivity type are p-type and n-type, respectively, and wherein the first and second bipolar transistors are PNP and NPN type, respectively.

8. A semiconductor device according to claim 1, wherein the third semiconductor layer has a thickness in a range about from 0.1 μm to 1 μm.

9. A semiconductor device according to claim 8, wherein the third semiconductor layer has a density of p-type impurities.

10. A semiconductor device according to claim 9, wherein each first semiconductor layer and the fifth semiconductor layer are comprised of laminate structures of semiconductors which are characterized as having different forbidden bandwidths.

11. A semiconductor device according to claim 10, wherein the stacked arrangement of semiconductor layers for providing both the first and second bipolar transistors are sequentially formed on first and second regions of a principal surface of said substrate using a molecular beam epitaxy technique.

12. A semiconductor device according to claim 10, wherein each first semiconductor layer includes a p-type GaAs layer, having an impurity density of about $1 \times 10^{19}/cm^3$ and thickness of about 0.5 μm, formed on a principal surface of a semi-insulating GaAs substrate and a p-type $Al_xGa_{1-x}As$ layer formed thereon, x=0.3 and having a p-type impurity density of about $5 \times 10^{17}/cm^3$ and thickness of about 0.1 μm, and wherein the fifth semiconductor layer includes an n-type $Al_xGa_{-x}As$ layer, x=0.3 and having an n-type impurity density of about $5 \times 10^{17}/cm^3$ and thickness of about 0.1 μm, formed on the fourth semiconductor layer and an n-type GaAs layer formed thereon an having a thickness of about 0.1 μm and n-type impurity density of about $5 \times 10^{18}/cm^3$.

13. A semiconductor device according to claim 12, wherein the first and second conductivity type are p-type and n-type, respectively, and wherein the first and second bipolar transistors are PNP and NPN type, respectively.

14. A semiconductor device comprising:
a first region on a substrate having a first bipolar transistor formed thereon, the first bipolar transistor including a stacked arrangement of:
a first semiconductor layer, for providing an emitter region, having a first conductivity type,
a second semiconductor layer, for providing a base region, being formed on the first semiconductor layer and having a second conductivity type, opposite to the first conductivity type,
a third semiconductor layer formed on the second semiconductor layer and having an impurity density equal to or smaller than $1 \times 10^{16}/cm^3$, the third semiconductor layer being substantially intrinsic.
a fourth semiconductor layer, for providing a collector region, being formed on the third semiconductor layer and having the first conductivity type,
an emitter electrode electrically connected to the first semiconductor layer,
a base electrode electrically connected to the second semiconductor layer, and
a collector electrode electrically connected to the fourth semiconductor layer; and
a second region on the substrate, at a different portion thereof, having a second bipolar transistor formed thereon, the second transistor including a second stacked arrangement of:
a first semiconductor layer having the first conductivity type,
a second semiconductor layer, for providing a collector region, being formed on the first semiconductor layer and having the second conductivity type,
a third semiconductor layer formed on the second semiconductor layer and having an impurity density equal to or smaller than $1 \times 10^{16}/cm^3$, the third semiconductor layer being substantially intrinsic,
a fourth semiconductor layer, for providing the base region, being formed on the third semiconductor layer and having the first conductivity type,
a fifth semiconductor layer, for providing the emitter region, being formed on the fourth semiconductor layer and having the second conductivity type,
a collector electrode thereof being electrically connected to the second semiconductor layer,
a base electrode thereof being electrically connected to the fourth semiconductor layer, and
a emitter electrode thereof being electrically connected to the fifth electrode,
wherein the stacked first, second, third and fourth semiconductor layers of the first region are disposed along planes which are in common and which would intersect, if extended, with planes corresponding to the first, second, third and fourth semiconductor layers of said second region, respectively.

15. A semiconductor device according to claim 14, wherein the third semiconductor layer has a thickness in a range about from 0.1 μm to 1 μm.

16. A semiconductor device according to claim 14, wherein each first semiconductor layer and the fifth semiconductor layer are comprised of laminate structures of semiconductors which are characterized as having different forbidden band-widths.

17. A semiconductor device according to claim 14, wherein the stacked arrangement of semiconductor layers for providing both the first and second bipolar transistors are sequentially formed on first and second regions of a principal surface of said substrate using a molecular beam epitaxy technique.

18. A semiconductor device according to claim 16, wherein each first semiconductor layer includes a p-type GaAs layer formed on a principal surface of the substrate layer and a p-type $Al_xGa_{1-x}As$ layer, x=0.3 formed thereon, and wherein the fifth semiconductor layer includes an n-type $Al_xGa_{1-x}As$ layer, x=0.3, formed on the fourth semiconductor layer and an n-type GaAs layer formed thereon.

19. A semiconductor device according to claim 16, wherein each first semiconductor layer includes a p-type GaAs layer, having an impurity density of about $1 \times 10^{19}/cm^3$ and thickness of about 0.5 μm, formed on a principal surface of a semi-insulating GaAs substrate and a p-type $Al_xGa_{1-x}As$ layer formed thereon, x=0.3 and having a p-type impurity density of about $5 \times 10^{17}/cm^3$ and thickness of about 0.1 μm, and wherein the fifth semiconductor layer includes an n-type $Al_xGa_{1-x}As$ layer, x=0.3 and having an n-type impurity density of about $5 \times 10^{17}/cm^3$ and thickness of about 0.1 μm, formed on the fourth semiconductor layer and an n-type GaAs layer formed thereon an having a thickness of about 0.1 μm and n-type impurity density of about $5 \times 10^{18}/cm^3$.

20. A semiconductor device according to claim 19, wherein the first and second conductivity type are p-type and n-type, respectively, and wherein the first and second bipolar transistors are PNP and NPN type, respectively.

21. A semiconductor device according to claim 14, wherein the first and second conductivity type are p-type and n-type, respectively, and wherein the first and second bipolar transistors are PNP and NPN type, respectively.

* * * * *